(12) United States Patent
Yoshimochi

(10) Patent No.: US 8,906,585 B2
(45) Date of Patent: Dec. 9, 2014

(54) METHOD OF MANUFACTURING SEMICONDUCTOR DEVICE AND EXPOSURE DEVICE

(71) Applicant: Renesas Electronics Corporation, Kawasaki (JP)

(72) Inventor: Kazuyuki Yoshimochi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/783,238

(22) Filed: Mar. 2, 2013

(65) Prior Publication Data
US 2013/0260294 A1    Oct. 3, 2013

(30) Foreign Application Priority Data
Mar. 28, 2012  (JP) ................. 2012-072860

(51) Int. Cl.
*G03F 7/20*   (2006.01)
(52) U.S. Cl.
CPC .......... *G03F 7/2041* (2013.01); *G03F 7/70891* (2013.01); *G03F 7/70314* (2013.01)
USPC ................. 430/30; 430/311; 355/30; 355/53; 355/55; 355/72; 355/77

(58) Field of Classification Search
CPC   G03F 7/2041; G03F 7/70341; G03F 7/70891
USPC ............... 430/30, 311; 355/30, 53, 55, 72, 77
See application file for complete search history.

(56) References Cited

U.S. PATENT DOCUMENTS
8,054,447 B2 *  11/2011  Nagasaka et al. ............... 355/53

FOREIGN PATENT DOCUMENTS
JP         2006-134999 A      5/2006

* cited by examiner

*Primary Examiner* — Christopher Young
(74) *Attorney, Agent, or Firm* — Miles & Stockbridge P.C.

(57) ABSTRACT

A method of manufacturing a semiconductor device in which the alignment accuracy of an immersion exposure device is maintained even when exposure steps are carried out intermittently. In the method, a substrate is placed on a stage of an exposure device (substrate placing step). Then, a first liquid is supplied to between the substrate and the optics system of the exposure device to expose the substrate through the first liquid (exposure step). A second liquid is supplied from a different place from the first liquid to a drainage groove provided around the stage at least in a period other than when the first liquid is supplied onto the stage, in order to suppress change in the temperature of the exposure device.

17 Claims, 13 Drawing Sheets

METHOD OF MANUFACTURING SEMICONDUCTOR DEVICE AND EXPOSURE DEVICE

CROSS-REFERENCE TO RELATED APPLICATIONS

The disclosure of Japanese Patent Application No. 2012-072860 filed on Mar. 28, 2012 including the specification, drawings and abstract is incorporated herein by reference in its entirety.

BACKGROUND

The present invention relates to a method of manufacturing a semiconductor device and an exposure device.

In recent years, a variety of exposure devices have been proposed.

Japanese Unexamined Patent Publication No. 2006-134999 describes the following exposure device. In the device, a groove is provided in an object table so as to fit the periphery of an object to be exposed. A cleaning liquid supply unit supplies a cleaning liquid to the groove. This structure is claimed to prevent foreign matter from adhering to the groove of the object table.

SUMMARY

The present inventors have found that the amount of liquid remaining in the drainage groove of the immersion exposure device affects the alignment accuracy in the exposure step.

According to one aspect of the present invention, there is provided a method of manufacturing a semiconductor device including the steps of: placing a substrate over a stage of an exposure device (substrate placing step); and supplying a first liquid to between the substrate and an optics system of the exposure device and exposing the substrate through the first liquid (exposure step). In the method, at least in a period other than when the first liquid is supplied onto the stage, a second liquid is supplied from a different place from the first liquid to a drainage groove provided around the stage to suppress change in the temperature of the exposure device.

According to another aspect of the present invention, there is provided an exposure device including: a stage over which a substrate is placed; an optics system for exposing the substrate; a first supply section for supplying a first liquid to between the substrate and the optics system; a drainage groove provided around the stage; a second supply section, located in a different place from the first supply section, for supplying a second liquid and flowing the second liquid into the drainage groove; and a control section for performing first control to supply the first liquid from the first supply section for exposure of the substrate and second control to supply the second liquid from the second supply section at least in a period other than when the first liquid is supplied onto the stage, in order to suppress change in temperature.

The present inventors have found that change in the amount of liquid in the drainage groove causes thermal deformation of the stage. If thermal deformation of the stage occurs, the alignment accuracy in the exposure step may deteriorate. For this reason, the present inventors have considered preventing thermal deformation of the stage by keeping some liquid always remaining in the drainage groove.

According to the present invention, the second liquid is supplied from a different place from the first liquid to the drainage groove provided around the stage at least in a period other than when the first liquid is supplied onto the stage. Consequently, some liquid always remains in the drainage groove. This prevents thermal deformation of the stage. Therefore, the alignment accuracy of the exposure device can be maintained even when exposure steps are carried out intermittently.

According to the present invention, the alignment accuracy of an immersion exposure device can be maintained even when exposure steps are carried out intermittently.

BRIEF DESCRIPTION OF THE DRAWINGS

FIGS. 12A and 12B are diagrams explaining a method of manufacturing a semiconductor device according to the fifth embodiment, in which FIG. 12A shows the amount of liquid in the drainage groove of a first stage and FIG. 12B shows the amount of liquid in the drainage groove of a second stage.

DETAILED DESCRIPTION

Figure 1:
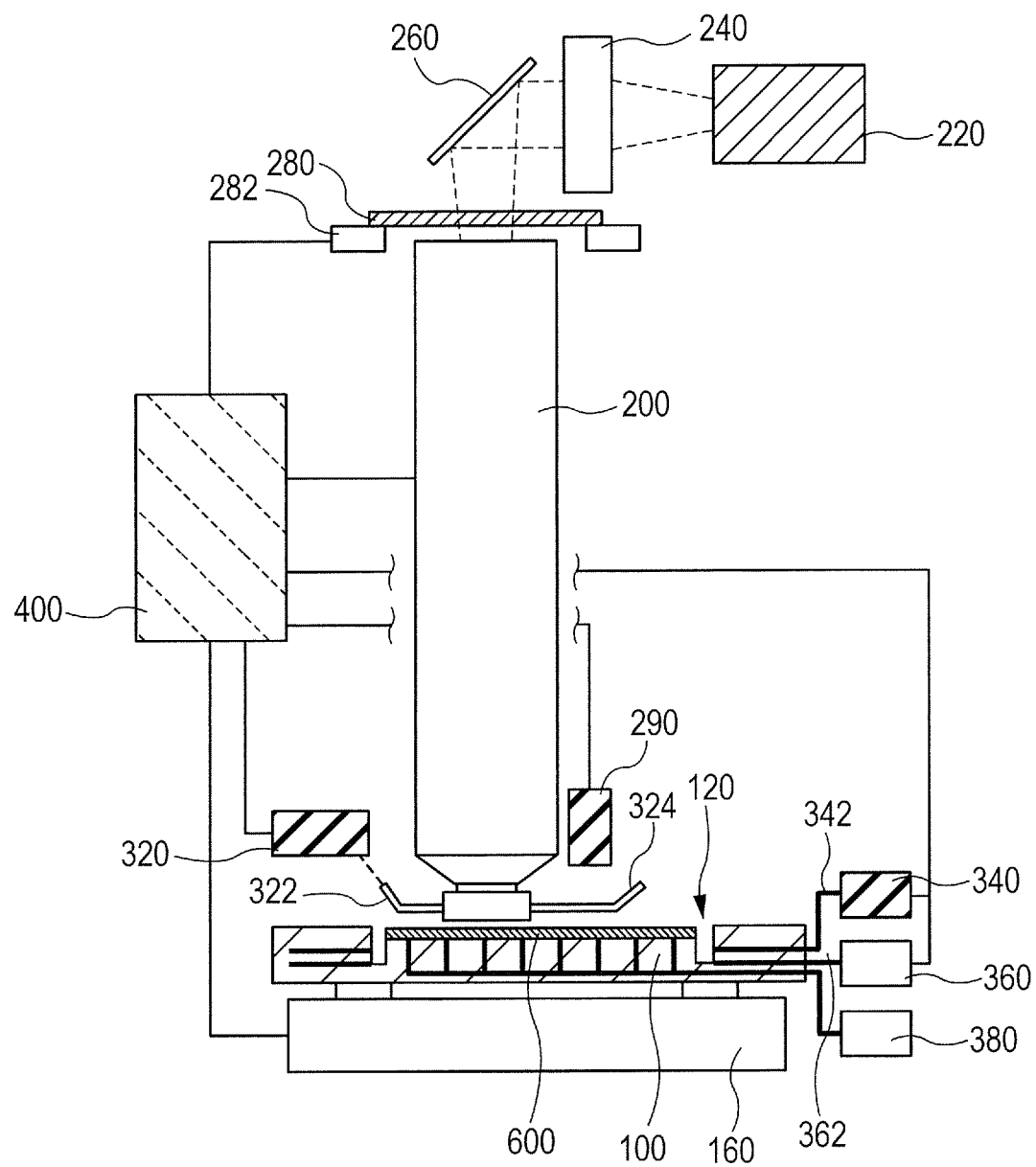
FIG. 1 shows the structure of an exposure device according to a first embodiment of the invention.

Next, the preferred embodiments of the present invention will be described referring to the accompanying drawings. In all the drawings, the same elements are designated by the same reference signs and repeated descriptions of the same elements are omitted as appropriate.

First Embodiment

A method of manufacturing a semiconductor device 10 and an exposure device 20 according to the first embodiment will be described referring to FIGS. 1 to 5. The method of manufacturing the semiconductor device 10 according to the first embodiment includes the following steps. First, a substrate 600 is placed on a stage 100 of the exposure device (substrate placing step). Then, a first liquid is supplied to between the substrate 600 and an optics system 200 of the exposure device 20 and the substrate 600 is exposed through the first liquid (exposure step). At least in a period other than when the first liquid is supplied onto the stage 100, a second liquid is supplied from a different place from the first liquid to a drainage groove 120 provided around the stage 100 to suppress change in the temperature of the exposure device 20. Details are given below.

Figure 4:
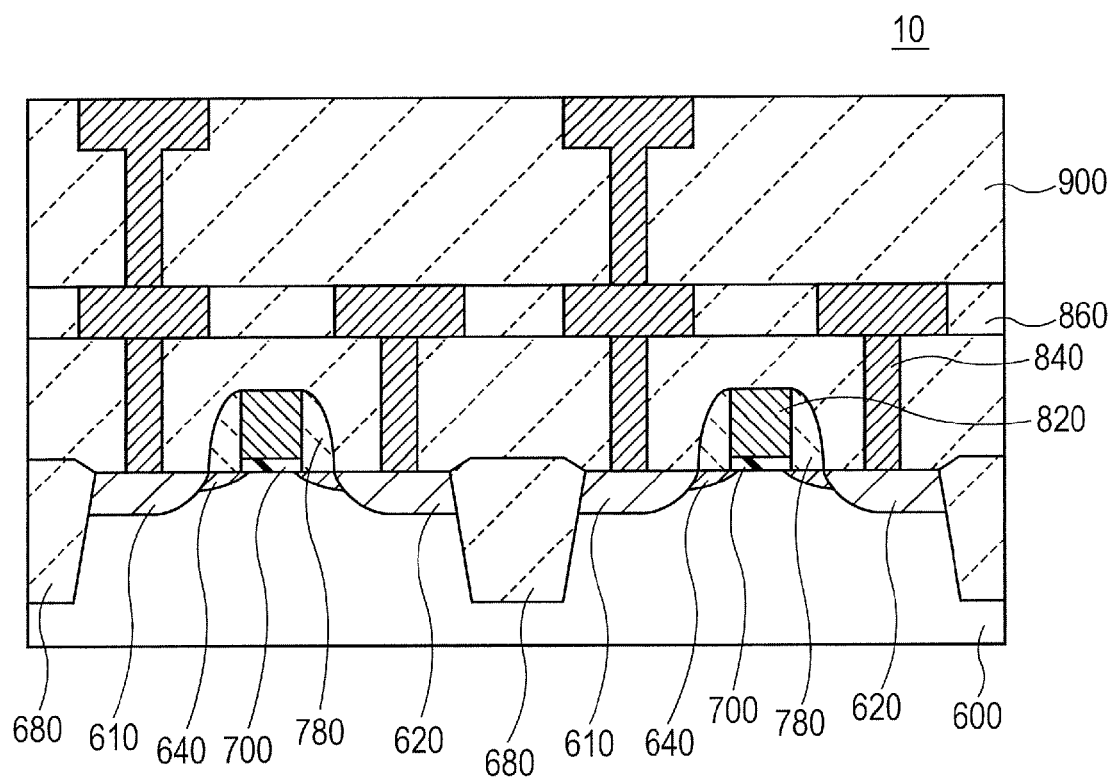
FIG. 4 is a sectional view illustrating a method of manufacturing a semiconductor device according to the first embodiment.

First, the method of manufacturing the semiconductor device 10 according to the first embodiment is outlined below referring to FIG. 4. FIG. 4 is a sectional view illustrating the method of manufacturing the semiconductor device 10 according to the first embodiment. The substrate 600 is, for example, a semiconductor substrate. Specifically, the substrate 600 is, for example, a silicon substrate.

As shown in FIG. 4, an element isolation region 680 with an opening (not designated by a reference sign in the figure) is formed in the substrate 600. For example, the element isolation region is made of $SiO_2$ by a LOCOS (Local Oxidation of Silicon) process. Alternatively the element isolation region 680 may be formed by an STI (Shallow Trench Isolation) process.

A gate insulating layer 700 and a gate electrode 820 are provided in prescribed places of the substrate 600 respectively. An extension region 640 is formed by implanting impurities into the substrate 600 using the gate insulating layer 700 and gate electrode 820 as a mask. Sidewall insulating film 780 is formed on the sidewalls of the gate insulating layer 700 and gate electrode 820.

A source region 610 and a drain region 620 are formed by implanting impurities into the substrate 600 using the gate electrode 820 and sidewall insulating film 780 as a mask.

An interlayer insulating layer 900 is provided over the substrate 600, gate electrode 820 and element isolation region 680. In the interlayer insulating layer 900, vias 840 which are in contact with the source region 610 and drain region 620 are provided. A wiring 860 is provided over each via 840. A plurality of such interlayer insulating layers 900 are stacked, thereby forming a multilayer wiring layer.

A photolithographic process is carried out for patterning for some constituent elements of the semiconductor device 10 thus structured. Specifically, a photolithographic process is carried out in the step of patterning for a mask layer of SiN or the like to form the element isolation region 680, the step of patterning for the gate insulating layer 700 and gate electrode 820, or the step of making via holes or wiring gutters to form vias 840 or wirings 860 in the interlayer insulating layer 900. The photolithographic process includes a step in which the exposure device 20 which will be described later is used to expose the photosensitive resin film (not shown) coated on the substrate 600.

Figure 2:
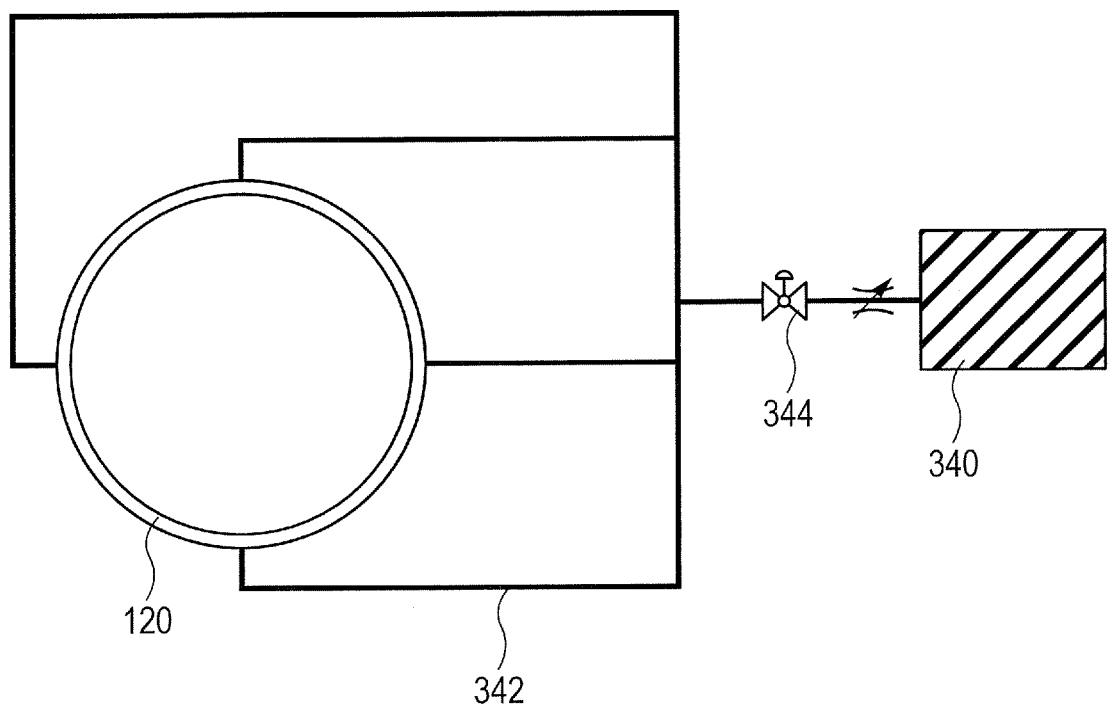
FIG. 2 is a plan view showing the structure of the exposure device according to the first embodiment.
Figure 3:
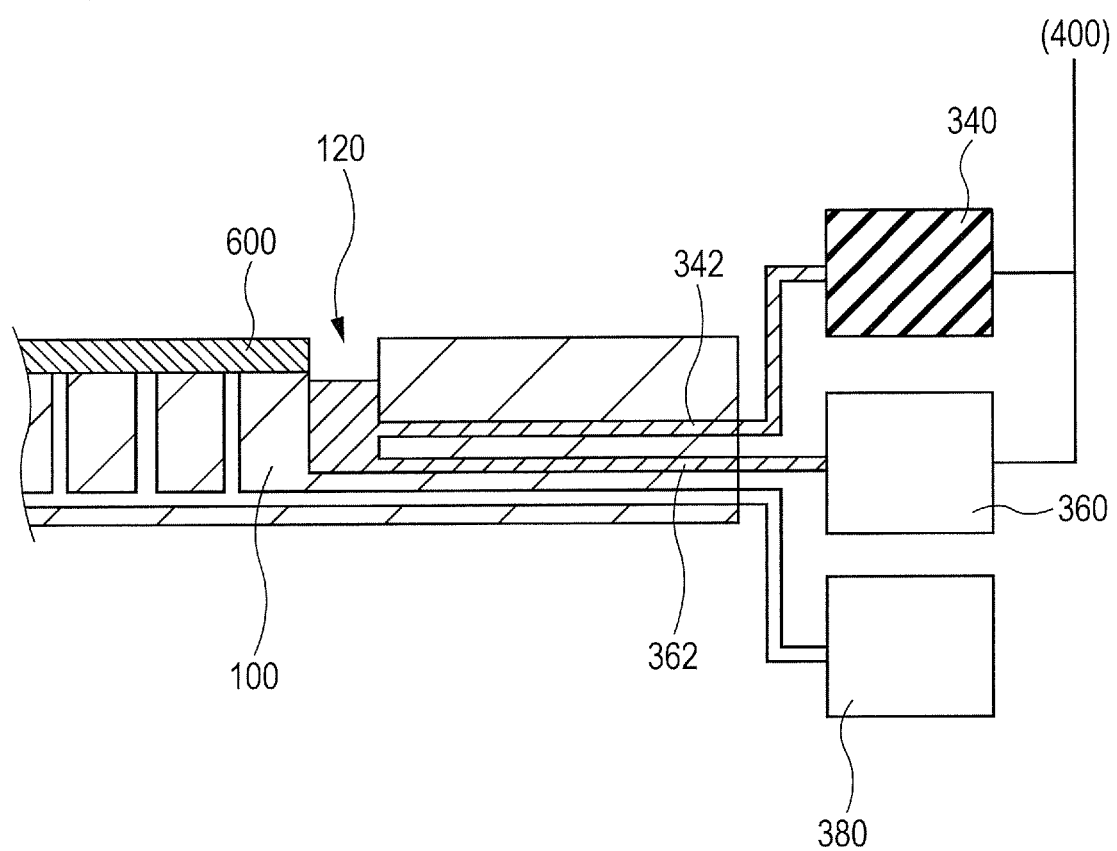
FIG. 3 shows the structure of the exposure device according to the first embodiment.

Next, the exposure device 20 according to the first embodiment will be described referring to FIGS. 1 to 3. FIG. 1 and FIG. 3 show the structure of the exposure device 20 according to the first embodiment. FIG. 2 is a plan view showing the structure of the exposure device 20 according to the first embodiment. The exposure device 20 according to the first embodiment includes a stage 100 on which a substrate 600 is placed, an optics system 200 for exposure of the substrate 600, a first supply section 320, a drainage groove 120, second supply section 340, and a control section 400. The first supply section 320 is located adjacently to the optics system 200 to supply a first liquid to between the substrate 600 and optics system 200. The drainage groove 120 is located around the stage 100. The second supply section 340 is located in a different place from the first supply section 320 to supply a second liquid and flow it in the drainage groove 120. The control section 400 performs first control to supply the first liquid from the first supply section 320 for exposure of the substrate 600 and second control to supply the second liquid from the second supply section 340 at least in a period other than when the first liquid is supplied onto the stage 100, in order to suppress change in the temperature of the exposure device 20. Details of the structure of the exposure device 20 are given below. The drawings to which reference is made below schematically illustrate the exposure device 20.

The exposure device 20 according to the first embodiment is an immersion exposure device. In the immersion exposure device, an exposure is made on the substrate 600 while a liquid is filled between the optics system 200 and the substrate 600 as the object to be exposed. This improves the exposure resolution by a ratio equivalent to the refractive index of the liquid.

As shown in FIG. 1, a light source 220, a condenser lens 240, a mirror 260, a reticle 280, and the optics system 200 are provided above the stage 100.

The light source 220 emits light to expose the substrate 600. The light source 220 is, for example, an ArF excimer laser. If that is the case, the wavelength of exposure light is 193 nm. Alternatively the light source 220 may be a KrF excimer laser. If that is the case, the wavelength of exposure light is 248 nm. The light source 220 emits light, for example, horizontally.

The condenser lens 240 is located on the light emission side of the light source 220. The condenser lens 240 converges light emitted from the light source 220. A diaphragm (not shown) may be located between the light source 220 and condenser lens 240.

The mirror 260 is located on the opposite side of the light source 220 with respect to the condenser lens 240. The mirror 260 reflects light coming from the condenser lens 240 toward the reticle 280.

The reticle 280 is located on the reflective side of the mirror 260. The reticle 280 rests on a reticle moving mechanism 282. The reticle moving mechanism 282 adjusts the position of the reticle 280. The reticle moving mechanism 282 has a position detecting unit (not shown) which detects the position of the reticle 280. The position detecting unit is, for example, a laser interferometer. The surface of the reticle 280 is perpendicular to the direction of light emission from the light source 220. The reticle moving mechanism 282 transmits a signal indicating the position of the reticle 280 to the control section 400.

The surface of the reticle 280 bears an exposure pattern (not shown). The exposure pattern is a pattern made by any of the abovementioned photolithographic processes. The reticle 280 is used, for example, for an exposure step in which process nodes are not less than 10 nm and not more than 90 nm. If the semiconductor device 10 has a logic circuit, half pitch of the exposure pattern is, for example, not less than 40 nm and not more than 90 nm. If the semiconductor device 10 has a memory circuit, half pitch of the exposure pattern is not less than 10 nm and not more than 28 nm. "Half pitch" here means the distance from the center of the line width of a gate electrode 820 to the center of a gate electrode adjacent to that gate electrode 820. High alignment accuracy is required in an exposure step to make an exposure of such a fine pattern. Therefore, this embodiment is particularly useful for making an exposure of such a fine pattern.

The optics system 200 is located vertically beneath the reticle 280. The optics system 200 includes a lens barrel (not designated by a reference sign in the figure), a plurality of lenses (not shown) and so on. The optics system 200 reduces exposure light passing through the reticle 280 and projects it on the substrate 600.

A substrate measuring section 290 is located near the optics system 200. The substrate measuring section 290 is coupled to the control section 400 through a wire (not designated by a reference sign in the figure). The substrate measuring section 290 measures the position and shape of the substrate 600 before the substrate 600 placed on the stage 100 is exposed.

The first supply section 320 has a first supply pipe 322. The first supply section 320 is coupled to an end of the optics system 200 through the first supply pipe 322. The first supply section 320 supplies the first liquid to between the substrate 600 and optics system 200 through the first supply piping 322.

Preferably the "first liquid" here is a liquid which has a larger refractive index than air and a high transmission factor at the wavelength of exposure light. Concretely the "first liquid" is, for example, water. Specifically, the first liquid is what is called ultrapure water. If the first liquid is ultrapure water, the refractive index of the first liquid is 1.436. Consequently the numerical aperture at exposure through the first liquid is larger than the numerical aperture at exposure in the air.

For example, a first drain pipe 324 is coupled to an end of the optics system 200 on the opposite side of the first supply pipe 322. The first drain pipe 324 partially or fully drains the first liquid supplied from the first supply section 320. The first drain pipe 324 may be coupled to a drainage mechanism (not shown). The drainage mechanism adjusts the flow rate in the first drain pipe 324. This makes it possible to carry out an exposure step without leaving the first liquid on the substrate 600. Also, all the first liquid may be drained into the drainage groove 120. The first drain pipe 324 may be coupled to the drainage groove 120 which will be described later.

The stage 100 rests on the stage moving mechanism 160. The substrate 600 coated with photosensitive resin film (not shown) is placed on the stage 100. The stage moving mechanism 160 can move the stage 100 in X, Y and Z directions. In the stage moving mechanism 160, the mechanism for movement in the X and Y directions (not shown) is, for example, a motor. By moving the stage in the X and Y directions, the shot area of the optics system 200 can be moved. In the stage moving mechanism 160, the mechanism for movement in the Z direction (not shown) is, for example, a piezo element. By moving the stage in the Z direction, an adjustment can be made so that light from the optics system 200 is focused on the substrate 600. The stage moving mechanism 160 further includes a position detecting unit (not shown) which detects the position of the stage 100 in the X, Y, and Z directions. The position detecting unit is, for example, a laser interferometer. If that is the case, the stage moving mechanism 160 transmits, for example, a signal indicating the position of the stage 100 in the X, Y, and Z directions to the control section 400.

As shown in FIG. 3, suction holes for fixing the substrate 600 (not designated by a reference sign in the figure) are provided in the stage 100. The suction holes are coupled to a substrate suction section 380 through a suction pipe (not designated by a reference sign in the figure). The substrate suction section 380 fixes the substrate 600 on the stage 100 by applying a negative pressure to the back side of the substrate 600.

Furthermore, as shown in FIG. 3, the drainage groove 120 is located around the stage 100. The "drainage groove 120" here means a groove to drain the first liquid for exposure and the second liquid which will be described later. The drainage groove 120 is part of the stage 100. This means that if the liquid in the drainage groove 120 vaporizes, the temperature of the drainage groove 120 side of the stage 100 goes down. Therefore, thermal deformation may occur in the drainage groove 120 side of the stage 100. In addition, the temperature of the stage 100 with no liquid in the drainage groove 120 would be different from the temperature of the stage 100 with some liquid in the drainage groove 120 (for example, during an exposure process). For this reason, the second liquid is supplied from the second supply section 340 to the drainage groove 120 to keep some liquid remaining in the drainage groove 120.

The second supply section 340 is located in a different place from the first supply section 320. The second supply section 340 has second supply pipes 342. The second supply section 340 is coupled to the drainage groove 120 through the second supply pipes 342. The second supply section 340 supplies the second liquid and flows it into the drainage groove 120. The second supply section 340 supplies the second liquid to the drainage groove 120 at least in a period other than when the first supply section 320 supplies the first liquid onto the stage 100. The temperature of the exposure device 20 is regulated in this way. Details of the method of regulating the second liquid in the process of manufacturing the semiconductor device 10 will be given later.

The "second liquid" here is such a liquid whose characteristics such as vaporization heat are known at least before an exposure step and do not change during the exposure step. For example, the "second liquid" has the same vaporization heat as the first liquid. In other words, the "second liquid" is the same as the first liquid in terms of specific heat. Furthermore, the "second liquid" is the same liquid as the first liquid. Concretely the "second liquid" is what is called ultrapure water, like the first liquid. Since the "second liquid" has the same vaporization heat as the first liquid, change in the temperature of the exposure device 20 can be suppressed by second control which will be described later. If the second liquid is different from the first liquid, the control section 400 should perform second control which will be described later, according to the thermal characteristics of the second liquid.

A drainage mechanism 360 is coupled to the drainage groove 120 through the drain pipe 362. The drainage mechanism 360 discharges the liquid in the drainage groove 120 out. The drainage mechanism 360 may be provided with a flow meter (not shown) which measures the amount of liquid discharged from the drainage groove 120. In this case, the drainage mechanism 360 transmits, to the control section 400, a signal indicating the amount of discharged liquid as measured by the flow meter.

Next, referring back to FIG. 1, the control section 400 of the exposure device 20 will be described. The control section 400 is coupled to the reticle moving mechanism 282, substrate measuring section 290, stage moving mechanism 160, first supply section 320, and second supply section 340 through wires (not designated by reference signs in the figure).

The control section 400 receives a signal indicating the position of the reticle 280 as transmitted from the reticle moving mechanism 282, a signal indicating the position of the stage 100 (X, Y, Z) as sent from the stage moving mechanism 160, and the result of measurement of the substrate 600 as transmitted from the substrate measuring section 290. According to these signals, the control section 400 transmits position control signals for adjusting their positions, to the reticle moving mechanism 282 and the stage moving mechanism 160. The reticle moving mechanism 282 adjusts the position of the reticle 280 according to the position control signal transmitted from the control section 400. The stage moving mechanism 160 moves the stage 100 according to the position control signal to adjust the position of the substrate 600.

The control section 400 makes the first supply section 320 supply the first liquid for exposure of the substrate 600 (first control). Specifically, in the step of exposing the substrate 600, the control section 400 transmits a first control signal to the first supply section 320 to perform the first control. The control section 400 may transmit a first control signal in the substrate measuring step as well. The first supply section 320 supplies the first liquid to between the substrate 600 and the optics system 200 as it receives the first control signal.

The control section 400 makes the second supply section supply the second liquid at least in a period other than when the first liquid is supplied onto the stage 100, in order to suppress change in the temperature of the exposure device 20 (second control). More specifically, in that period the control section 400 transmits a second control signal for the second control to the second supply section 340. The second supply section 340 supplies the second liquid and flows it into the drainage groove 120 as it receives the second control signal.

The control section 400 may include a storage (not shown). For example, the storage may store the amount of first liquid supplied from the first supply section 320, the cubic capacity of the drainage groove 120, or the time required for a startup step which will be described later, and so on.

The above constituent members of the exposure device 20 may be controlled so that they have the same temperatures. Furthermore, before the stage 600 is placed on the stage 100, its temperature may be adjusted to the temperature of the exposure device 20. Concretely, the exposure device 20 incorporates a heater (not shown). The heater controls the exposure device 20 so that the temperature of the device is the same as the atmospheric temperature of the clean room.

Next, the structure of the drainage groove 120 and its vicinity as seen from above will be described in detail referring to FIG. 2. FIG. 2 is a plan view showing the structure of the exposure device 20 according to the first embodiment. The figure schematically shows the structure of the drainage groove 120 and its vicinity, in which the other constituent elements are omitted.

As shown in FIG. 2, the drainage groove 120 is located in a way to surround the area of the stage 100 where the substrate 600 is to be placed. The drainage groove 120 is, for example, circular.

The second supply section 340 further includes, for example, a valve 344 for adjusting the supply of the second liquid. The second supply section 340 is coupled to the second supply pipes 342 through the valve 344.

The second supply pipes 342 are coupled to the drainage groove 120 at regular intervals in a plan view. The second supply section 340 supplies the second liquid through the second supply pipes 342. The second supply pipes 342 extend, for example, in four directions. In this case, among the four second supply pipes 342, two second supply pipes 342 are located so that they are opposite to each other with the area of the stage 100 for holding the substrate 600 between them. Since the second supply pipes 342 are coupled to the drainage groove 120 at regular intervals in a plan view in this way, change in the temperature of the stage 100 can be suppressed uniformly in a plan view.

Figure 5:
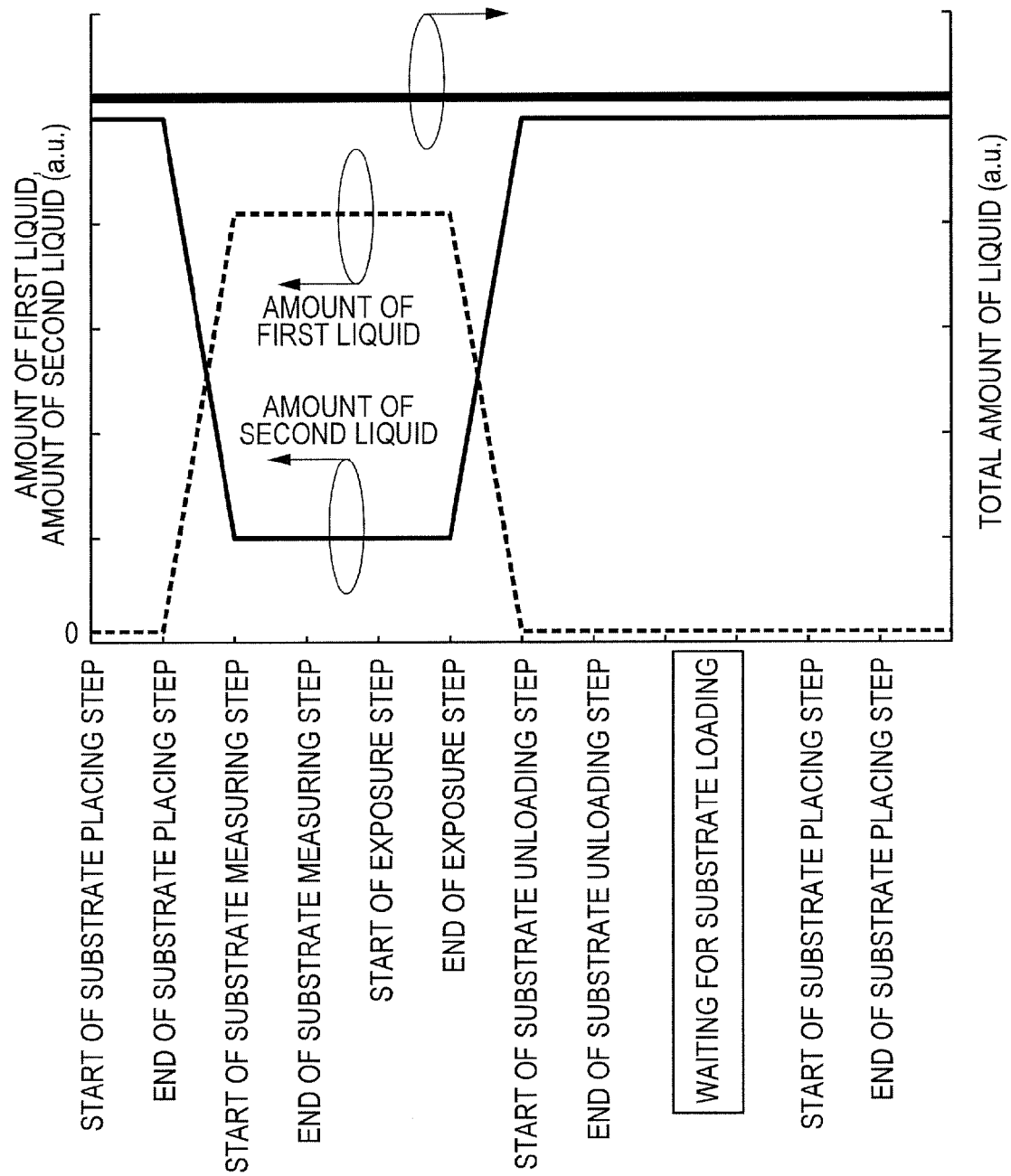
FIG. 5 is a diagram explaining the method of manufacturing a semiconductor device according to the first embodiment.

Next, the amount of liquid in the drainage groove 120 in the process of manufacturing the semiconductor device 10 will be explained referring to FIG. 5. FIG. 5 is a diagram explaining the method of manufacturing the semiconductor device 10 according to the first embodiment.

As shown in FIG. 5, a transfer robot (not shown) places a substrate 600 coated with photosensitive resin film (not shown) on the stage 100 of the exposure device 20 (substrate placing step). For example, during this step, the control section 400 transmits a signal for performing the above second control to the second supply section 340. The second supply section 340 supplies the second liquid to the drainage groove 120 according to the signal to suppress change in the temperature of the exposure device 20.

Next, after the substrate placing step and before the exposure step, the position and shape of the substrate 600 are measured (substrate measuring step). According to the first embodiment, in the substrate measuring step, the optics system 200 is in a position above the stage 100. Therefore, in the substrate measuring step, the first supply section 320 starts supplying the first liquid to between the substrate 600 and optics system 200.

At this time, the control section 400 keeps the total amount of the first and second liquids remaining in the drainage groove 120 constant. This prevents the drainage groove 120 from becoming dry. In other words, change in the temperature of the stage 100 can be suppressed. In addition, the heat capacity of the entire stage 100 including the liquid in the drainage groove 120 can be kept constant. Therefore, the amount of thermal deformation of the stage 100 can be kept constant.

The total amount of liquid in the drainage groove 120 can be kept constant in two ways.

The first approach is to estimate the amount of first liquid flowing into the drainage groove 120 in advance. Concretely, information on the amount of first liquid is stored in the storage of the control section 400.

The amount of first liquid supplied by the first supply section 320 should be enough to fill the space between the optics system 200 and substrate 600. So, the amount of first liquid can be estimated based on the size of the optics system 200. When the amount of first liquid is known in advance, the total amount of liquid in the drainage groove 120 can be kept constant as follows.

When the first supply section 320 starts supplying the first liquid, the control section 400 transmits, to the second supply section 340, a signal for decreasing the amount of second liquid by the amount equivalent to the amount of first liquid. The second supply section 340 decreases the amount of second liquid according to the signal. The total amount of liquid in the drainage groove 120 is thus kept constant. Contrariwise, when the first supply section 320 stops supplying the first liquid, the amount of second liquid should be increased by the same procedure.

The second approach is to measure the amount of liquid discharged from the drainage groove 120. Concretely the drainage groove 360 should have a flow meter for measuring the amount of liquid discharged from the drainage groove 120.

The amount of liquid discharged from the drainage groove 120 is constant or can be controlled to be constant. Therefore, by knowing the cubic capacity of the drainage groove 120 in advance, the total amount of liquid remaining in the drainage groove 120 can be calculated from the amount of liquid discharged from the drainage groove 120. For example, the total amount of liquid in the drainage groove 120 can be kept constant as follows.

The flow meter measures the amount of discharged liquid all the time or even in periods other than the exposure step. The drainage mechanism 360 transmits a signal indicating the amount of discharged liquid as measured by the flow meter to the control section 400. When the first supply section 320 starts supplying the first liquid, the amount of discharged liquid increases. The control section 400 transmits, to the second supply section 340, a signal for decreasing the amount of second liquid by the amount equivalent to the amount of increase in the discharged liquid. The second supply section 340 decreases the amount of second liquid according to the signal. The total amount of liquid in the drainage groove 120 can be kept constant. Contrariwise, when the first supply section 320 stops supplying the first liquid, the amount of second liquid should be increased by the same procedure.

Next, after the substrate measuring step, an exposure step is carried out. In the exposure step, the first supply section 320 supplies the first liquid to between the substrate 600 and optics system 200. The substrate 600 is exposed through the first liquid. In the exposure step, the shot area on the substrate is shifted by scanning the stage 100. When the entire substrate 600 is exposed, the exposure step is ended.

After the exposure step, the substrate 600 is unloaded from the stage 100 (substrate unloading step). At this time the first supply section 320 stops supplying the first liquid. Accordingly the control section 400 transmits, to the second supply section 340, a signal for increasing the second liquid by the amount equivalent to amount of decrease in the first liquid. Thus the control section 400 keeps the total amount of first and second liquids in the drainage groove 120 constant.

After the substrate unloading step, the exposure device waits for loading of a next substrate for a given time. When the next substrate is loaded, the substrate placing step and subsequent steps are carried out again.

The above steps are carried out cyclically. In these cycles, the second supply section 340 supplies the second liquid to the drainage groove 120 at least in a period other than when the first supply section 320 supplies the first liquid onto the stage 100, in order to prevent change in the temperature of the exposure device 20. In the first embodiment, the control section 400 keeps the total amount of first and second liquids remaining in the drainage groove 120 constant.

Next, the advantageous effect of the first embodiment will be explained.

With the recent tendency toward miniaturization of the semiconductor device 10, there is a demand for high alignment accuracy in the exposure device 20 used in the exposure step. Specifically, an alignment accuracy of several nanometers or less is considered as desirable. Therefore, even a slight thermal deformation in the exposure device 20 might produce a pattern defect in the semiconductor device 10.

Next, a first comparative example of an exposure device 20 without a second supply section 340 will be considered. In this comparative example, the first liquid is supplied to between the substrate 600 and optics system 200 only while immersion exposure is carried out in the exposure step. After the exposure step, supply of the first liquid is stopped.

During this process, the first liquid on the stage 100 gradually vaporizes. The first liquid does not always vaporize with in-plane uniformity. Also the first liquid does not always vaporize at a constant speed. Therefore, the amount of vaporization of the first liquid is not constant temporally and spatially. Accordingly, when the temperature of the stage 100 changes, thermal deformation of the stage 100 occurs. The thermal deformation of the stage 100 affects the alignment accuracy of the exposure device 20.

For example, when the first liquid remaining in the drainage groove 120 vaporizes, the temperature of the drainage groove 120 side of the stage 100 goes down. Thermal deformation first occurs in the drainage groove 120 side of the stage 100. Consequently the alignment accuracy on the plane of the stage 100 might deteriorate.

The drainage groove 120 might be dry until a next substrate 600 is loaded. The temperature of the stage 100 with no liquid in the drainage groove 120 is different from the temperature of the stage 100 with some first liquid in the drainage groove 120 as in the exposure step. In this case, even if the first liquid is supplied before a next exposure step begins, the temperature of the stage 100 is not always the same as in the preceding exposure step. Therefore, alignment accuracy might differ at different times in the process of manufacturing the semiconductor device 10.

As discussed above, the alignment accuracy of the exposure device 20 might vary from one exposure step to another.

Next, an exposure device 20 without a second supply section 340 will be considered as a second comparative example in which an exposure step is carried out on a dummy substrate. If exposure steps are not carried out cyclically, the first liquid might vaporize and cause deterioration in the alignment accuracy of the exposure device 20 as described above. A possible solution to this problem is to carry out an exposure step on a dummy substrate. In this case, the first liquid is made to flow in the drainage groove 120 by carrying out a dummy exposure step. As a consequence, in the exposure step for a next substrate 600, the temperature of the exposure device 20 should be at a steady state level. The required alignment accuracy can be thus restored. However, due to the time required for exposure of the dummy substrate, the throughput of the exposure device 20 may deteriorate.

As a third comparative example, the technique described in Japanese Unexamined Patent Publication No. 2006-134999 discloses that a cleaning liquid supply unit supplies a cleaning liquid to a drainage groove 120. The cleaning liquid is a liquid for removing foreign matter adhering to the groove. However, the drainage groove 120 is not always filled with the cleaning liquid. If cleaning steps are carried out irregularly in terms of time, the temperature of the stage 100 might fluctuate.

By contrast, according to the first embodiment, the second liquid is supplied to the drainage groove 120 provided around the stage 100 from a different place from the first liquid at least in a period other than when the first liquid is supplied onto the stage 100. This ensures that there is always some liquid in the drainage groove 120. Consequently in the period other than when the first liquid is supplied onto the stage 100, the temperature of the stage 100 is the same as in the exposure step. In other words, thermal deformation of the stage is suppressed.

In addition, according to the first embodiment, while the second liquid is supplied to the drainage groove 120, the temperature of the exposure device 20 is kept constant. Even if exposure steps are not carried out cyclically, namely if exposure steps are carried out intermittently, the throughput of the exposure device 20 will not deteriorate.

As explained above, according to the first embodiment, even if exposure steps are carried out intermittently, the alignment accuracy of the exposure device can be kept constant.

In the first embodiment, it is not always necessary to detect the temperature of the exposure device 20 or the temperature of the stage 100. As far as there is always some liquid in the drainage groove 120, the temperature of the stage 100 can be kept constant. It is advisable to adopt a method of keeping the total amount of first and second liquids in the drainage groove 120 constant as in the first embodiment.

Second Embodiment

Figure 6:
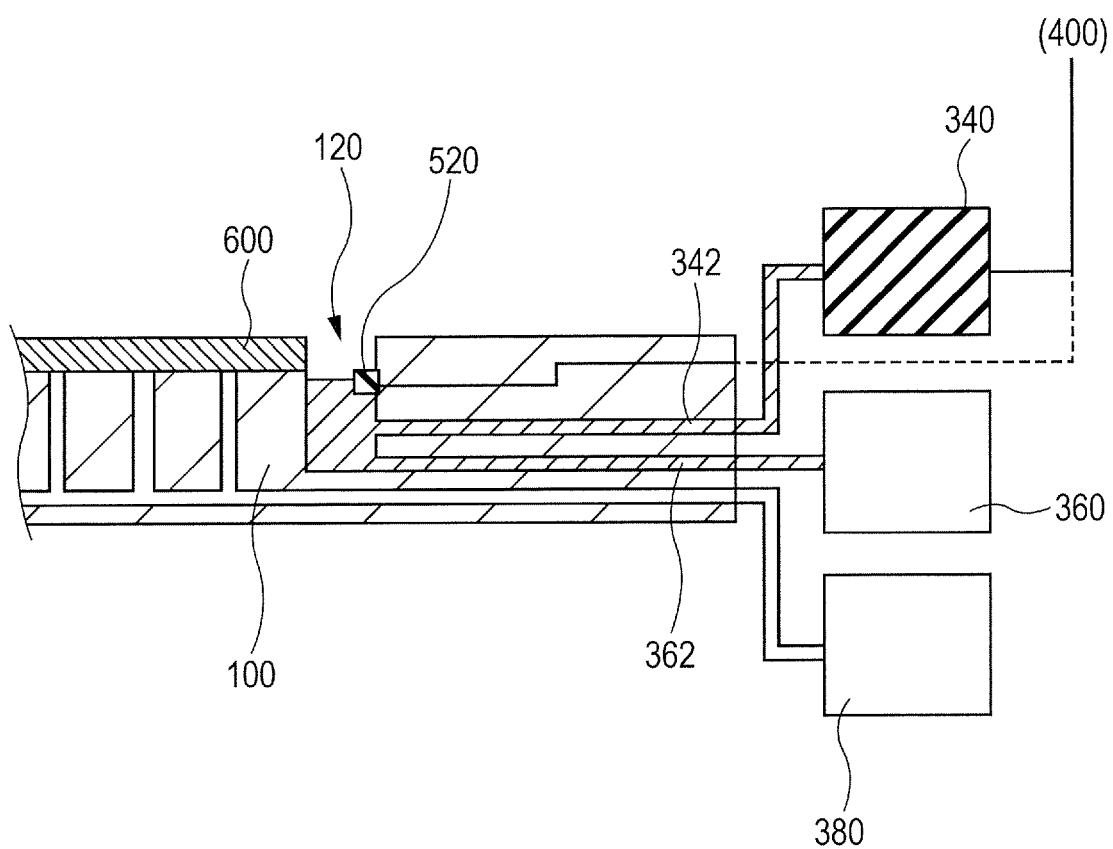
FIG. 6 shows the structure of an exposure device according to a second embodiment of the invention.

FIG. 6 shows the structure of an exposure device 20 according to the second embodiment. The second embodiment is the same as the first embodiment except the method of controlling the total amount of liquid in the drainage groove 120. Details are given below.

As shown in FIG. 6, the exposure device 20 is provided, for example, with a liquid level sensor 520. The liquid level sensor 520 is located, for example, at a position which is the same as the liquid level when the drainage groove 120 is full of liquid. The liquid level sensor 520 is coupled to the control section 400 through a wire (not designated by reference sign in the figure). When the liquid level sensor 520 touches the liquid, it transmits, to the control section 400, a signal indicating that the liquid level reaches the position of the liquid level sensor 520.

Figure 7:
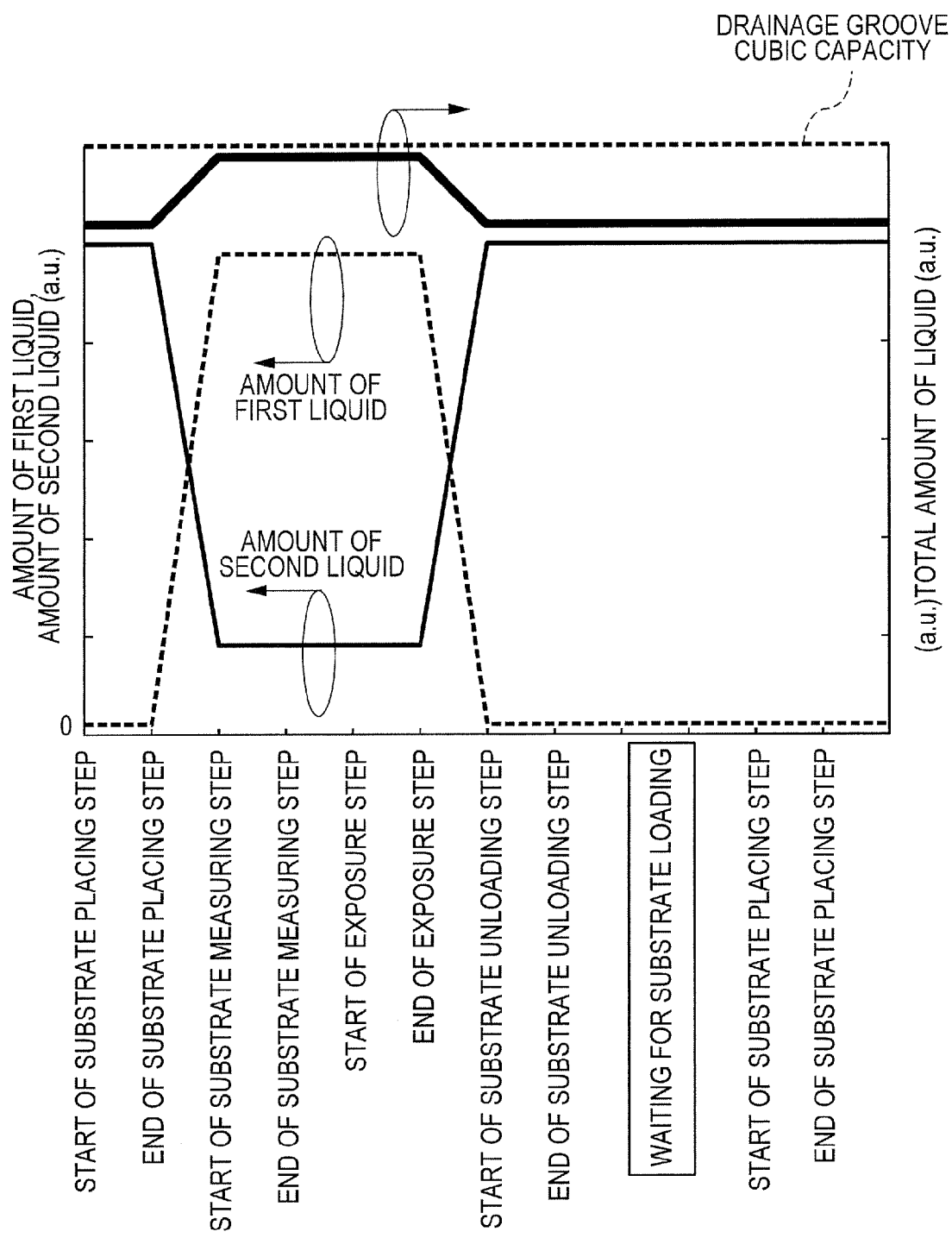
FIG. 7 is a diagram explaining the method of manufacturing a semiconductor device according to the second embodiment.

Next, a method of manufacturing the semiconductor device 10 according to the second embodiment will be described referring to FIG. 7. FIG. 7 is a diagram explaining the method of manufacturing the semiconductor device 10 according to the second embodiment.

As shown in FIG. 7, first the substrate placing step is carried out. In this step, the second supply section 340 supplies a second liquid to the drainage groove 120 to suppress change in the temperature of the exposure device 20. In the second embodiment, the second supply section 340 supplies, for example, a fixed amount of second liquid to the drainage groove 120 in periods other than when the first supply section 320 supplies a first liquid onto the stage 100. The amount of supplied second liquid here is smaller than the cubic capacity of the drainage groove 120. The amount of supplied liquid is previously stored in the storage of the control section 400.

Next, after the substrate placing step and before the exposure step, the position and shape of the substrate 600 are measured (substrate measuring step). In the substrate measuring step, the first supply section 320 starts supplying the first liquid to between the substrate 600 and optics system 200.

At this time, the control section 400 keeps the amount of liquid remaining in the drainage groove 120 below the overflow level of the drainage groove 120. This prevents the drainage groove 120 from becoming dry. In other words, change in the temperature of the stage 100 can be suppressed. In addition, the heat capacity of the entire stage 100 including the liquid in the drainage groove 120 can be kept within a given range. Therefore, the amount of thermal deformation of the stage 100 can be kept within a given range.

For example, the control section 400 keeps the level of liquid in the drainage groove 120 below its overflow level as follows.

When the first supply section 320 starts supplying the first liquid, the total amount of liquid in the drainage groove 120 begins to increase. Then, the liquid level in the drainage groove 120 goes up and touches the liquid level sensor 520. At this time, the liquid level sensor 520 transmits, to the control section 400, a signal indicating that the liquid level reaches the position of the liquid level sensor 520. As the control section 400 receives the signal from the liquid level sensor 520, it transmits a signal for decreasing the amount of second liquid to the second supply section 340. The second supply section 340 decreases the amount of second liquid according to the signal. Consequently the total amount of liquid does not exceed the cubic capacity of the drainage groove 120. In other words, the liquid does not overflow from the drainage groove 120.

Furthermore, when the liquid level in the drainage groove 120 goes up, the liquid level sensor 520 continues to transmit the above signal to the control section 400. Meanwhile, the control section 400 continues to transmit the signal for decreasing the amount of second liquid to the second supply section 340. The second supply section 340 continues to decrease the amount of second liquid according to the signal. The liquid remaining in the drainage groove 120 is kept from overflowing from the drainage groove 120 in this way. Contrariwise, when the first supply section 320 stops supplying the first liquid, the amount of second liquid should be increased by the same procedure.

Next, after the substrate measuring step, the exposure step is carried out. The subsequent steps are the same as in the first embodiment.

The second embodiment brings about the same advantageous effect as the first embodiment. Also, according to the second embodiment, the liquid remaining in the drainage groove 120 is kept from overflowing from the drainage groove 120. Consequently the drainage groove 120 does not overflow. This suppresses change in the temperature of the stage 100. In addition, the heat capacity of the entire stage 100 including the liquid in the drainage groove 120 can be kept within a given range. Consequently the amount of thermal deformation of the stage 100 can be kept within a given range.

If the second liquid is different from the first liquid, contact of the second liquid with the substrate 600 might cause a pattern defect. Therefore, since the liquid remaining in the drainage groove 120 is kept from overflowing from the drainage groove 120, the substrate 600 placed on the stage 100 is prevented from touching the second liquid.

The second embodiment has been explained above on the assumption that the second supply section 340 supplies a fixed amount of second liquid. Alternatively the second supply section 340 may supply an arbitrary amount of second liquid. If that is the case, the control section 400 controls the amount of supplied second liquid according to a signal from the liquid level sensor 520.

Third Embodiment

Figure 8:
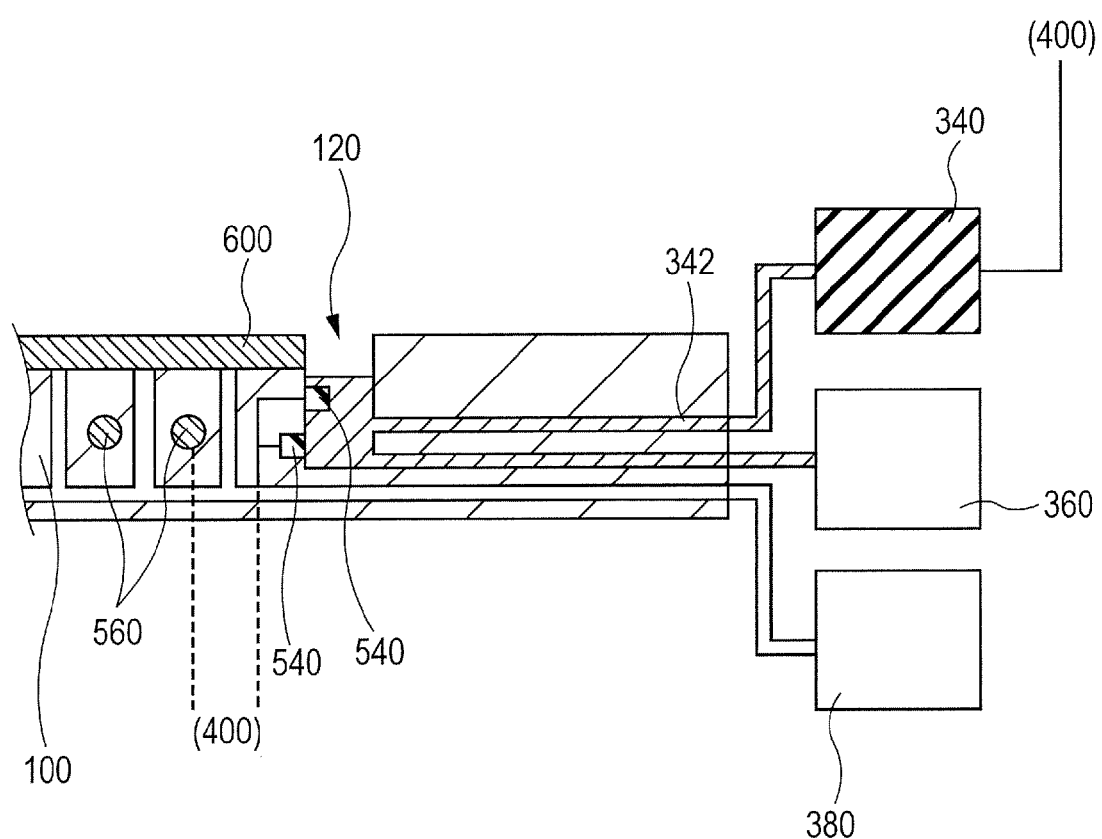
FIG. 8 shows the structure of an exposure device according to a third embodiment of the invention.

FIG. 8 shows the structure of an exposure device 20 according to the third embodiment. The third embodiment is the same as the first embodiment except that the exposure device 20 further includes a temperature sensor 540 located near the drainage groove 120. Details are given below.

As shown in FIG. 8, a temperature sensor 540 which measures temperatures is located near the drainage groove 120. In this case, two temperature sensors 540 are provided. One of the temperature sensors 540 is, for example, embedded in the stage 100. This sensor can measure the temperature of the stage 100. The other temperature sensor 540 is located inside the drainage groove 120. This sensor can measure the temperature of liquid remaining in the drainage groove 120.

Each temperature sensor 540 is coupled to the control section 400 through a wire (not designated by a reference sign in the figure). The temperature sensor 540 transmits a signal indicating the measured temperature to the control section 400. The "measured temperature" here means the temperature of the stage 100 or the temperature of the liquid in the drainage groove 120.

In addition, a temperature regulator 560 is provided in the stage 100. For example, the temperature regulator 560 regulates the temperature of the stage 100. The temperature regulator 560 is, for example, a heater installed in the stage 100 which is spiral in a plan view. The temperature regulator 560 may be located in another place in the exposure device 20. The control section 400 is coupled to the temperature regulator 560 through a wire (not designated by a reference sign in the figure).

Figure 9:
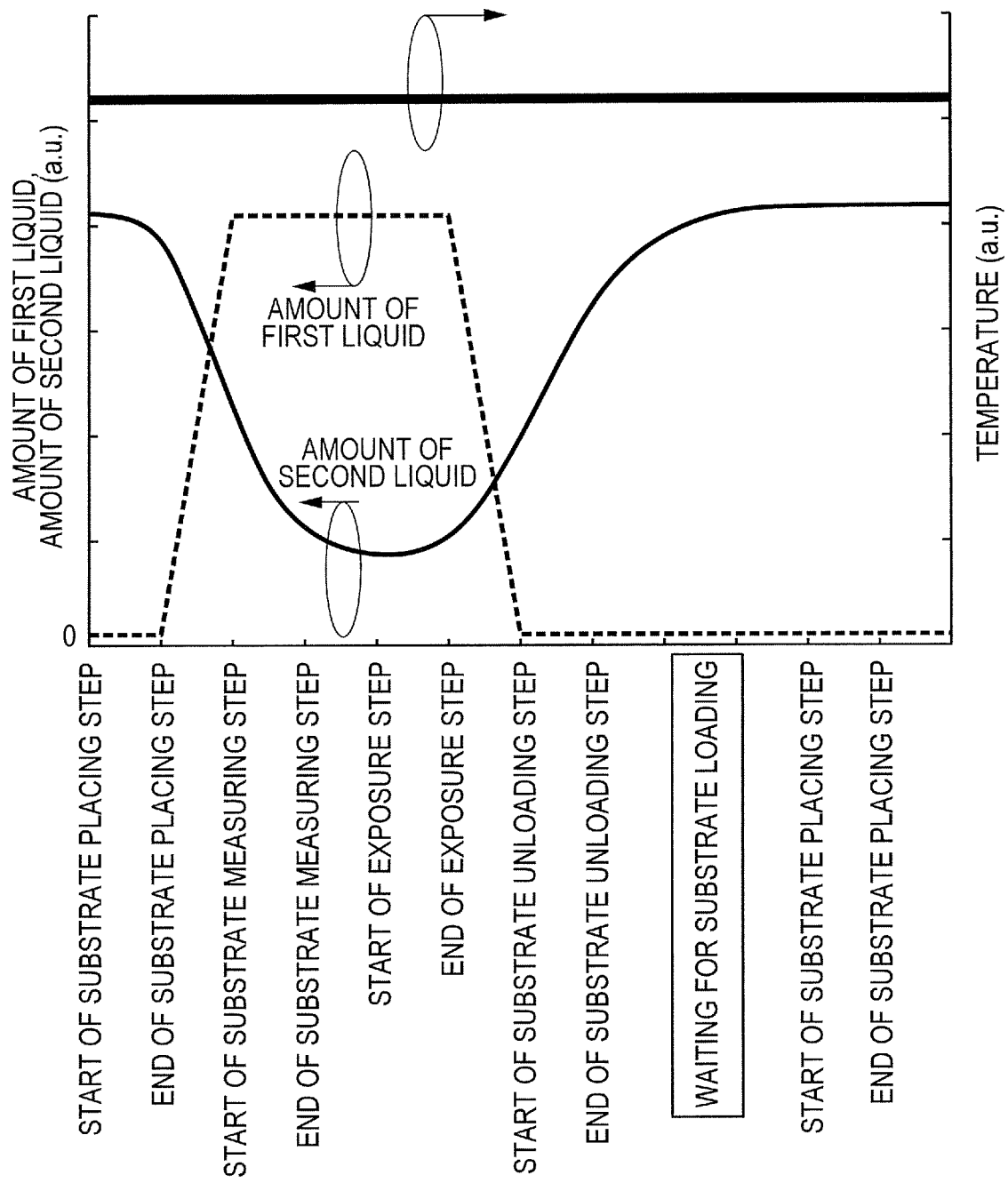
FIG. 9 is a diagram explaining the method of manufacturing a semiconductor device according to the third embodiment.

Next, a method of manufacturing the semiconductor device 10 according to the third embodiment will be described referring to FIG. 9. FIG. 9 is a diagram explaining the method of manufacturing the semiconductor device 10 according to the third embodiment.

The third embodiment assumes that even if the first supply section 320 and second supply section 340 supply a maximum amount of first liquid and a maximum amount of second liquid respectively, the total amount of first and second liquids does not exceed the cubic capacity of the drainage groove 120.

As shown in FIG. 9, the substrate placing step is first carried out. In this step, the second supply section 340 supplies a second liquid to the drainage groove 120. The temperature sensor 540 transmits a signal indicating the measured temperature to the control section 400.

The control section 400 regulates the total amount of first and second liquids remaining in the drainage groove 120 according to the temperature measured by the temperature sensor 540 so that the temperature becomes a prescribed temperature. Specifically, the control section 400 regulates the amount of second liquid which is supplied from the second supply section 340. Thus the amount of second liquid is regulated while the temperature is directly monitored. This suppresses change in the temperature of the exposure device 20. Consequently, thermal deformation of the stage 100 does not occur. The amount of second liquid need not be constant.

Next, after the substrate placing step and before the exposure step, the position and shape of the substrate 600 are measured (substrate measuring step). In the substrate measuring step, the first supply section 320 starts supplying the first liquid to between the substrate 600 and optics system 200.

When the first supply section 320 starts supplying the first liquid, the total amount of liquid in the drainage groove 120 begins to increase. At this time, the temperature of the stage 100 or the temperature of the drainage groove 120 slightly changes. The temperature sensor 540 transmits a signal indicating the changed temperature to the control section 400. The control section 400 regulates the total amount of first and second liquids remaining in the drainage groove 120 according to the temperature measured by the temperature sensor 540 in the same way as mentioned above so that the temperature becomes a prescribed temperature. Specifically, the control section 400 transmits a signal for decreasing the amount of second liquid to the second supply section 340. The second supply section 340 decreases the amount of second liquid according to the signal. Change in the temperature of the exposure device 20 is thus suppressed. Contrariwise, when the first supply section 320 stops supplying the first liquid, the amount of second liquid should be increased by the same procedure.

Next, after the substrate measuring step, the exposure step is carried out. The subsequent steps are the same as in the first embodiment.

In the above series of steps, there may be a case that the temperature cannot be controlled just by regulating the total amount of liquid remaining in the drainage groove 120. If that is the case, the control section 400 may regulate the temperature by the temperature regulator 560, for example, according to the temperature measured by the temperature sensor 504 so that the temperature becomes a prescribed temperature. This ensures that change in the temperature of the exposure device 20 is suppressed.

The third embodiment brings about the same advantageous effect as the first embodiment. According to the third embodiment, a temperature sensor 540 is located near the drainage groove 120. The control section 400 regulates the total amount of first and second liquids remaining in the drainage groove 120 according to the temperature measured by the temperature sensor 540 so that the temperature becomes a prescribed temperature. The amount of second liquid is thus regulated while the temperature is directly monitored. This ensures that thermal deformation of the stage 100 is suppressed.

Fourth Embodiment

Figure 10:
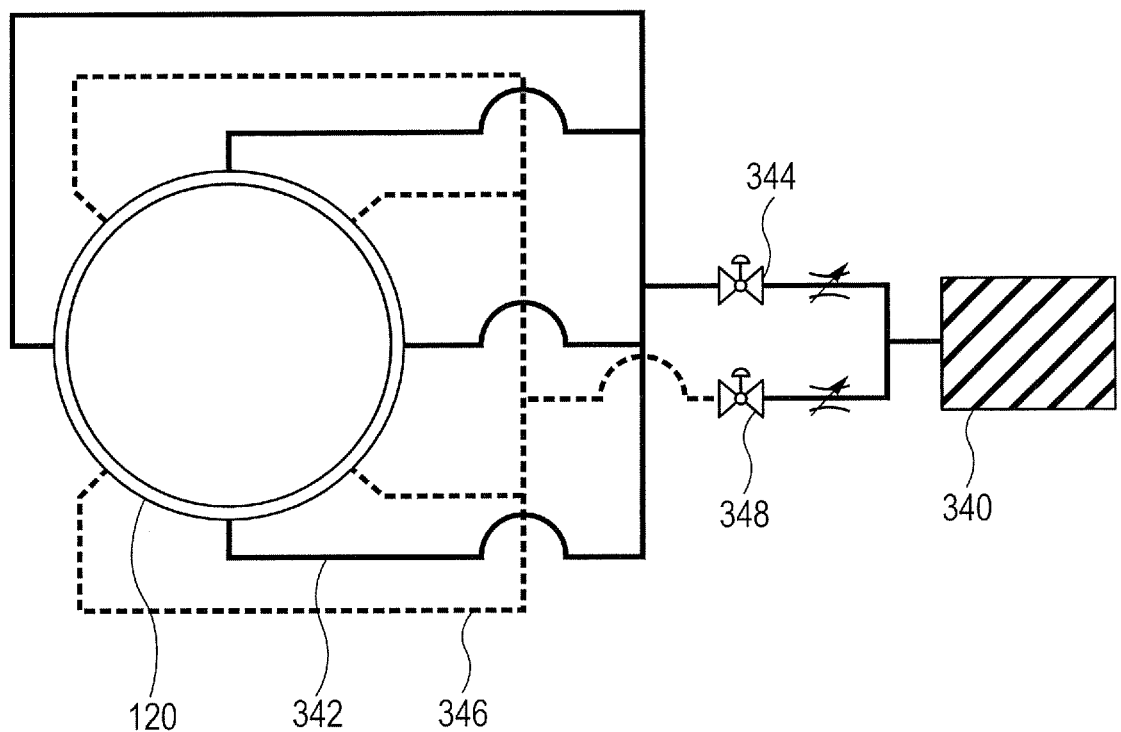
FIG. 10 shows the structure of an exposure device according to a fourth embodiment of the invention.

FIG. 10 is a plan view showing the structure of an exposure device 20 according to the fourth embodiment. The fourth embodiment is the same as the first embodiment except that it includes different types of second supply pipes. Details are given below.

As shown in FIG. 10, large flow rate supply pipes 342 and small flow rate supply pipes 346 are provided. For example, the diameter of the large flow rate supply pipes 342 is larger than that of the small flow rate supply pipes 346. The second supply pipes 342 and the second supply pipes 346 have a valve 344 and a valve 348, respectively. In this case, the second supply pipes 342 and the second supply pipes 346 are coupled to the same second supply section 340.

A large amount of second liquid can be flowed into the drainage groove 120 by opening a valve 344 in the second supply pipes 342. On the other hand, a small amount of second liquid can be flowed into the drainage groove 120 by opening a valve 348 in the second supply pipes 346.

The second supply pipes 342 and the second supply pipes 346 are alternately arranged in parallel and coupled to the drainage groove 120 at regular intervals. Consequently, change in the temperature of the stage 100 is suppressed uniformly in a plan view.

The fourth embodiment brings about the same advantageous effect as the first embodiment. According to the fourth embodiment, different types of second supply pipes may be provided. This makes it possible to regulate the flow rate of the second liquid depending on the temperature of the stage 100.

Fifth Embodiment

Figure 11:
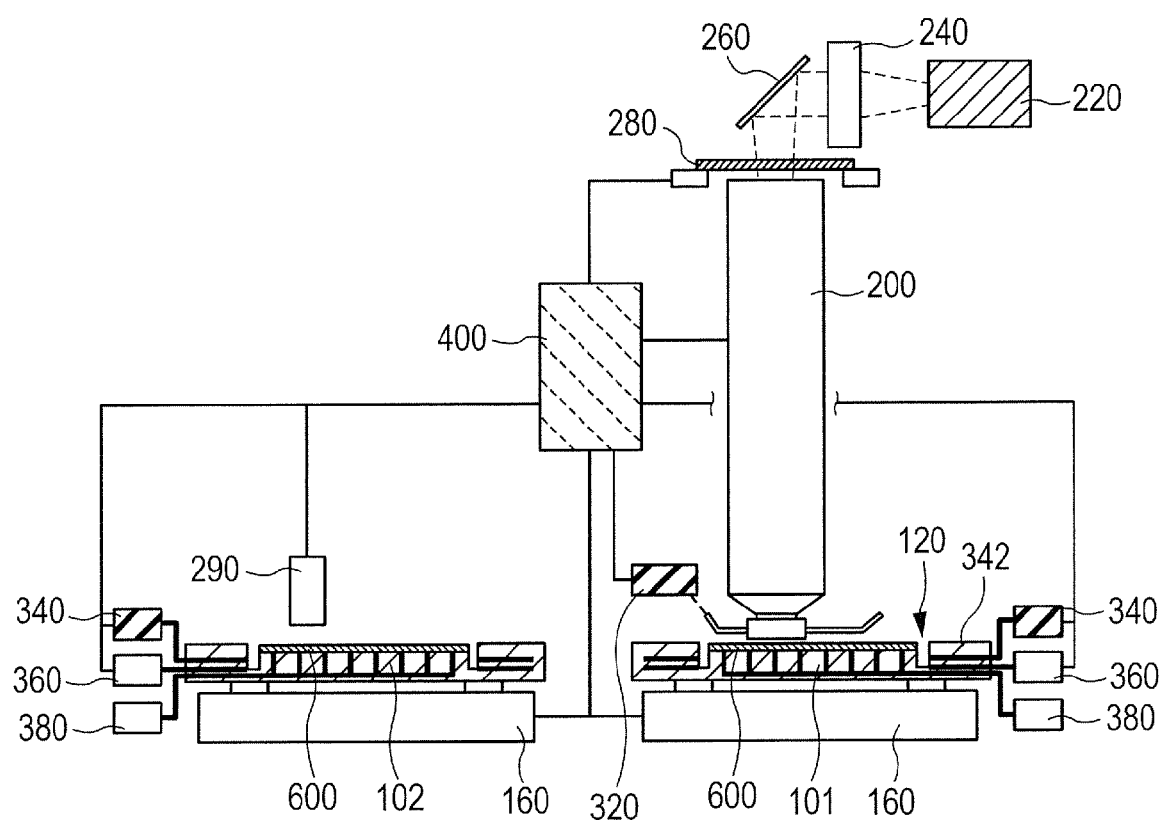
FIG. 11 shows the structure of an exposure device according to a fifth embodiment of the invention.

FIG. 11 shows the structure of an exposure device 20 according to the fifth embodiment. The fifth embodiment is the same as the first embodiment except that a plurality of stages are provided. Details are given below.

As shown in FIG. 11, in the fifth embodiment, a larger number of stages than the optics system 200 are provided. Specifically, a first stage 101 and a second stage 102 are provided for one optics system 200. More stages may be provided for one optics system.

The first stage 101 and the second stage 102 have the same structure. The first stage 101 and the second stage 102 are independent of each other and each provided with a second supply section 340.

The control section 400 moves the first stage 101 and the second stage 102 through stage moving mechanisms 160. The first stage 101 and the second stage 102 move to the space beneath the optics system 200 by changing places with each other. Thus, substrates 600 placed on the stages can be exposed in turn.

The figure shows that the first stage 101 is located beneath the optics system 200. On the other hand, the second stage 102 is not located beneath the optics system.

A substrate measuring section 290 is provided above the second stage 102 which is not located beneath the optics system 200. The substrate measuring section 290 is coupled to the control section 400 through a wire (not designated by a reference sign in the figure). The substrate measuring section 290 measures the position and shape of the substrate 600 placed on the second stage 102 while an exposure is made on the substrate 600 placed on the first stage 101. This improves the throughput of the exposure device 20.

Figure 12A:
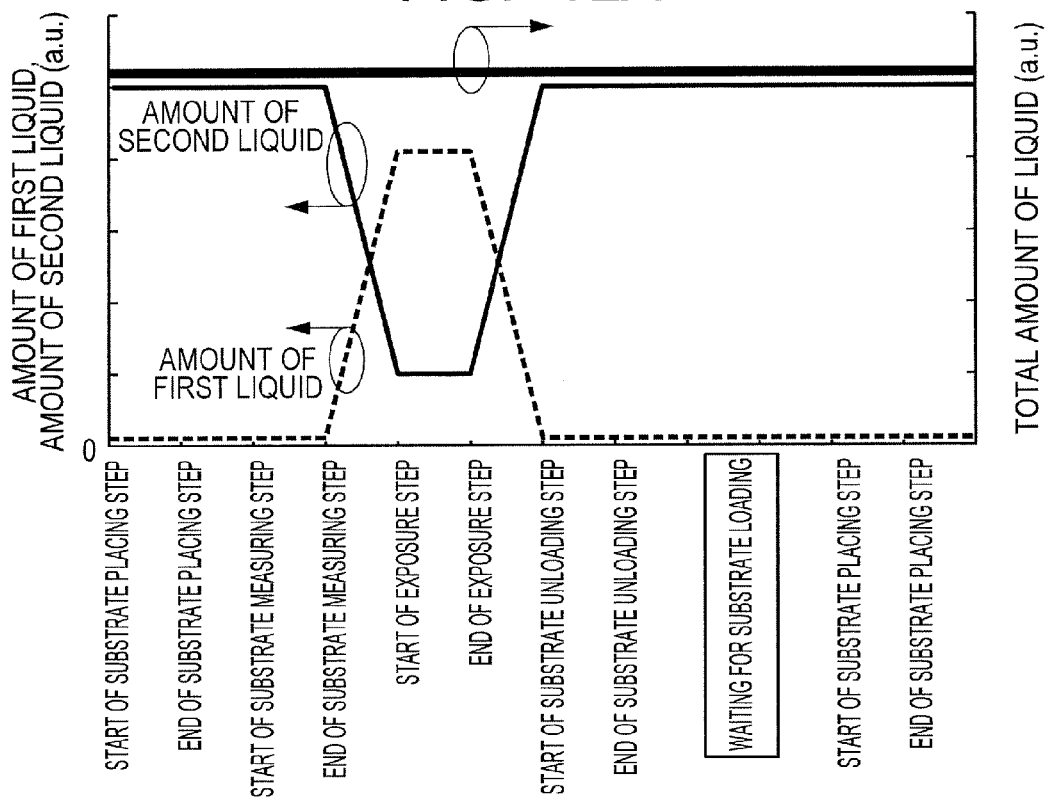
Figure 12B:
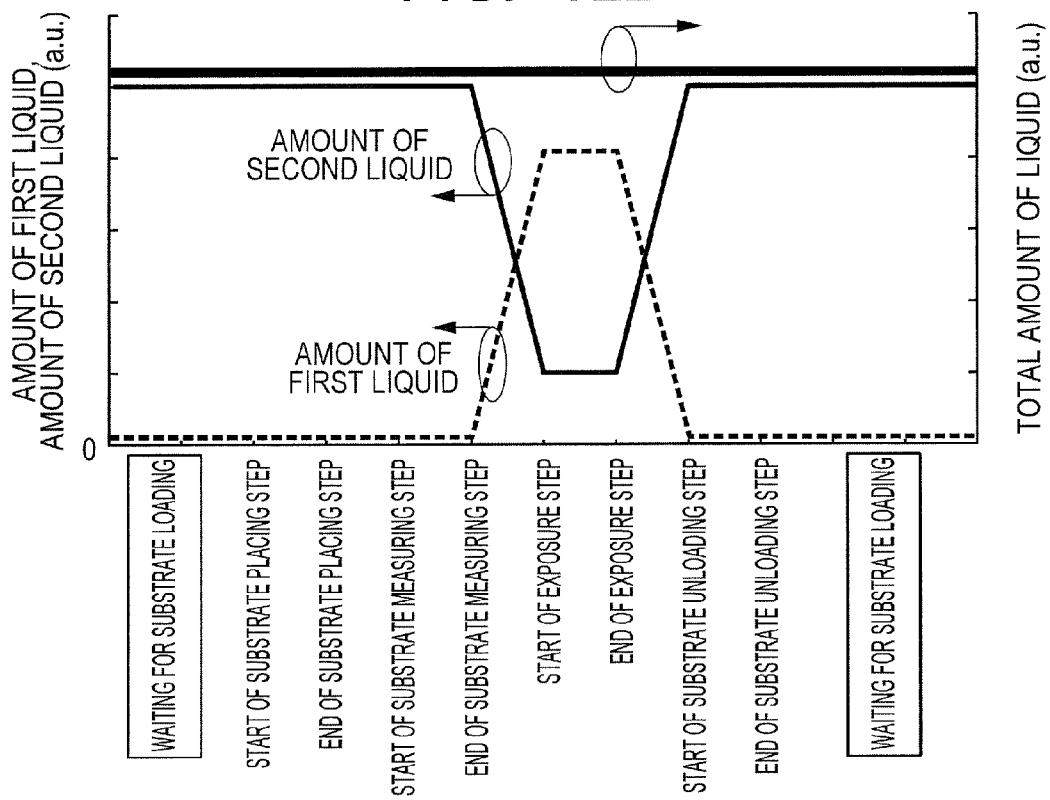

Next, a method of manufacturing the semiconductor device 10 according to the fifth embodiment will be described referring to FIGS. 12A and 12B. FIGS. 12A and 12B are diagrams explaining the method of manufacturing the semiconductor device 10 according to the fifth embodiment. FIG. 12A shows the amount of liquid in the drainage groove 120 of the first stage 101. FIG. 12B shows the amount of liquid in the drainage groove 120 of the second stage 102.

As shown in FIGS. 12A and 12B, first the substrate placing step is carried out for the first stage 101. Meanwhile, the second stage 102 is waiting for loading of a substrate 600.

During the step, the second supply section 340 for each stage supplies a second liquid to the drainage groove 120 to suppress change in the temperature of the exposure device 20.

Next, after the substrate placing step and before the exposure step, the control section 400 moves the first stage 101 to the space beneath the substrate measuring section 290. There the substrate measuring section 290 measures the position and shape of the substrate 600 placed on the first stage 101 (substrate measuring step). In the substrate measuring step according to the fifth embodiment, the optics system 200 is not located above the first stage 101. Therefore, in the substrate measuring step, a first liquid is not supplied onto the first stage 101. On the other hand, the exposure step is carried out for the second stage 102.

Next, the control section 400 moves the first stage 101 to the space beneath the optics system 200. On the other hand, it moves the second stage 102 to the space beneath the substrate measuring section 290. Then, the exposure step is carried out on the substrate 600 placed on the first stage 101. At this time, the first supply section 320 starts supplying the first liquid to the first stage 101. On the other hand, the substrate placing step is carried out for the second stage 102. Then, the measuring step is carried out on the substrate 600 placed on the second stage 102.

While the exposure step is being carried out on the substrate 600 placed on the first stage 101, the second liquid is supplied to the drainage groove 120 of the second stage 102. If three or more stages are provided, the second liquid is supplied to all stages other than the first stage 101. Consequently, while the exposure step is carried out on the substrate 600 placed on the first stage 101, thermal deformation of the second stage 102, to which the first liquid is not supplied, is suppressed.

While the exposure step is carried out on the substrate 600 placed on the first stage 101, the second liquid is supplied to the second stage 102 (at least one of the other stages) and the substrate measuring step is carried out on the substrate 600 placed on the second stage 102 (at least one of the other stages). For the second stage 102, the second liquid is supplied to its drainage groove 120 to maintain alignment accuracy. Thus, in the period when the exposure step is carried out on the substrate 600 placed on the first stage 101, the substrate measuring step is carried out on the substrate 600 placed on the second stage 102 while the alignment accuracy for the second stage 102 is maintained. Therefore, the alignment accuracy of the exposure device 20 is maintained and its throughput is improved.

Next, the control section 400 moves the second stage 102 to the space beneath the optics system 200. Then, the substrate is unloaded from the first stage 101 (substrate unloading step). Meanwhile, the exposure step is carried out on the substrate 600 placed on the second stage 102.

The above steps are repeated on the first stage 101 and second stage 102 in turn. As for the first stage 101 and second stage 102, the second liquid is supplied to the drainage groove 120 of each stage at least in a period other than when the first liquid is supplied to the stage, thereby suppressing change in the temperature of the exposure device 20.

The fifth embodiment brings about the same advantageous effect as the first embodiment. Also, according to the fifth embodiment, a larger number of stages than the optics system 200 are provided. While the exposure step is carried out on the substrate 600 placed on the first stage 101, the second liquid is supplied to the drainage groove 120 of another stage. Consequently, even while the exposure step is carried out on the substrate 600 placed on the first stage 101, the alignment accuracy for the other stage to which the first liquid is not supplied is maintained.

Sixth Embodiment

Figure 13:
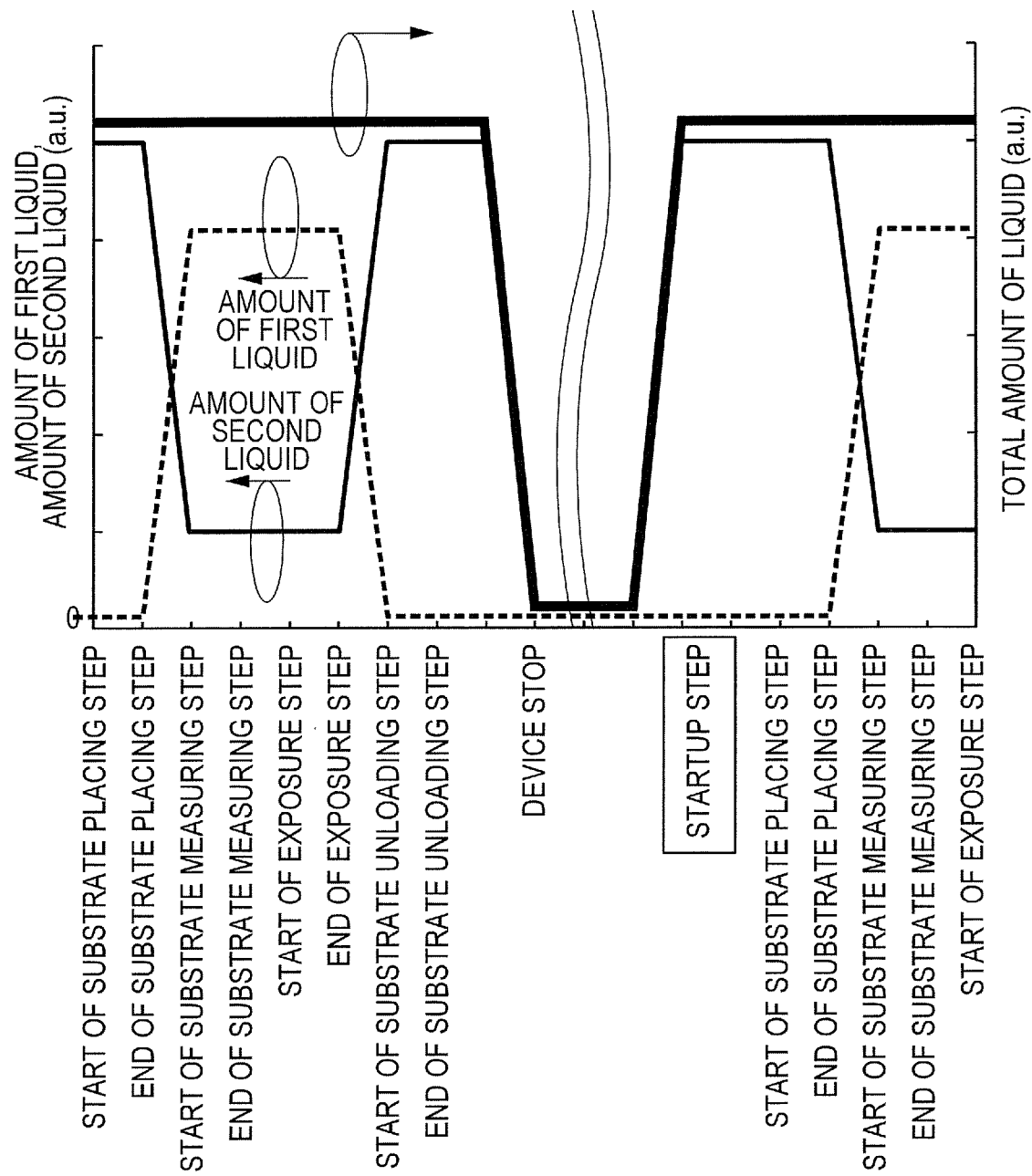
FIG. 13 is a diagram explaining a method of manufacturing a semiconductor device according to a sixth embodiment of the invention.

FIG. 13 is a diagram explaining a method of manufacturing the semiconductor device 10 according to the sixth embodiment. The sixth embodiment is the same as the first embodiment except that a startup step to bring the temperature of the exposure device 20 to a steady state level is carried out after the device has stopped. Details are given below.

The exposure device 20 does not always process a plurality of substrates 600 cyclically and successively. For example, when a cassette (not shown) holding 25 substrates 600 is loaded in the exposure device 20, the substrates 600 in the cassette are successively processed. Then, while a next cassette is not loaded, the exposure device 20 temporarily stops. At this time, the exposure device 20 enters a so-called idle state. The "idle state" here means a state in which the exposure device 20 is at a stop without processing a substrate 600 and waiting for loading of a substrate 600. The "state in which the exposure device is at a stop" here means a state in which at least the first liquid or second liquid is not supplied.

Next, the startup step after stop of the exposure device 20 will be concretely explained, referring to FIG. 13.

As shown in FIG. 13, the process from the substrate placing step to the substrate unloading step is carried out in the same manner as in the first embodiment. Let's assume that no substrate 600 is carried in for a certain period after the substrate unloading step. This is the "state in which the exposure device 20 is at a stop." After that period has elapsed, when a substrate 600 to be processed next is carried in, the exposure device 20 is restarted.

When the exposure device 20 at a stop is restarted, the second liquid is supplied to the drainage groove 120 to bring the temperature of the exposure device 20 to a steady state level (startup step). The time from when the startup step is started until the exposure step is started again is longer than the time from loading of substrates 600 in the exposure device 20 until start of the exposure step when the exposure steps are successively carried out. In other words, when the exposure device 20 at a stop is restarted, the startup step is additionally required before starting the process for a next substrate 600.

The "steady state" of the temperature of the exposure device 20 is a temperature state in which a plurality of substrates 600 are processed cyclically and successively.

The duration of the startup step is shorter than the time from the substrate placing step to the end of the exposure step for one substrate 600. In other words, the duration of the startup step is shorter than the time required to process a dummy substrate.

In the startup step, the temperature of the exposure device 20 is measured, for example, by a temperature sensor. When the temperature of the exposure device 20 reaches the steady state level, the startup step is ended. Then, the substrate placing step is carried out. Thus the alignment accuracy of the exposure device 20 is restored before starting the exposure step again.

Also, time required for the startup step may be preset. To that end, the time required for the temperature of the exposure device 20 to reach the steady state level should be measured in advance by supplying the second liquid to the drainage groove 120. The measured time is stored in the storage of the control section 400. In this case as well, the alignment accuracy of the exposure device 20 is restored before starting the exposure step can again.

The sixth embodiment brings about the same advantageous effect as the first embodiment. According to the sixth embodiment, after the exposure device 20 has stopped, the startup step is carried out to restart it. Specifically, the temperature of the exposure device 20 is brought to the steady state level by supplying the second liquid to the drainage groove 120. Thus, even after the exposure device 20 has stopped, the alignment accuracy of the exposure device 20 is restored before starting the exposure step again.

Several preferred embodiments of the present invention have been so far described in which the second liquid is supplied to the drainage groove 120 to suppress change in the temperature of the exposure device 20. Two or more of these embodiments may be combined.

So far the preferred embodiments of the present invention have been described referring to the accompanying drawings, but they are just for illustrative purposes and the invention may be embodied in various forms other than the abovementioned forms.

What is claimed is:

1. A method of manufacturing a semiconductor device comprising the steps of:
    placing a substrate on a stage of an exposure device;
    supplying a first liquid, from a first liquid supply, between the substrate and an optics system of the exposure device;
    exposing the substrate through the first liquid;
    at least in a period other than when the first liquid is supplied, supplying a second liquid, from a second liquid supply, into a drainage groove formed in the stage, the drainage groove having an upper portion that surrounds the substrate; and
    retaining at least one of the first and second liquids within the drainage groove to suppress a change in the temperature of the stage.

2. The method of manufacturing a semiconductor device according to claim 1,
    wherein the second liquid has the same heat of evaporation as the first liquid.

3. The method of manufacturing a semiconductor device according to claim 1, further comprising:
    keeping a total liquid amount remaining in the drainage groove constant.

4. The method of manufacturing a semiconductor device according to claim 1, further comprising:
    preventing the liquid remaining in the drainage groove from overflowing out of the drainage groove.

5. The method of manufacturing a semiconductor device according to claim 1, further comprising:
    measuring, using at least one of a temperature sensor located in the stage near the drainage groove and a temperature sensor located in the drainage groove, a temperature.

6. The method of manufacturing a semiconductor device according to claim 5, further comprising:
    regulating, based on the temperature measured by the temperature sensor, a total liquid amount remaining in the drainage groove so that the temperature becomes a prescribed temperature.

7. The method of manufacturing a semiconductor device according to claim 5, wherein the stage includes a temperature regulator, the method further comprising:
    regulating, based on the temperature measured by the temperature sensor, the temperature to a prescribed temperature.

8. The method of manufacturing a semiconductor device according to claim 1,
    wherein a larger number of the stages than the optics system are provided; and
    wherein while the exposure is carried out on the substrate placed over a first one of the stages, the second liquid is supplied to the drainage groove of another one of the stages other than the first stage.

9. The method of manufacturing a semiconductor device according to claim 8, further comprising:
    after the substrate placing and before the exposure, measuring a position and a shape of the substrate; and
    while the exposure is carried out on the substrate placed over the first stage, supplying the second liquid to the drainage groove of the other stage and carrying out the substrate measuring on the substrate placed over the other stage.

10. The method of manufacturing a semiconductor device according to claim 1, further comprising:
    supplying the second liquid to the drainage groove when restarting the exposure device after stop of the exposure device to bring the temperature of the exposure device to a steady state level,
    wherein time from start of the restart of the exposure step is shorter than time from loading of the substrate into the exposure device to start of the exposure when carrying out the exposure successively.

11. The method of manufacturing a semiconductor device according to claim 1, further comprising:
    supplying the second liquid to the drainage groove when restarting the exposure device after stop of the exposure device to bring the temperature of the exposure device to a steady state level,
    wherein duration of the restart is shorter than time from the substrate placing for at least one of the substrates to end of the exposure for the substrate.

12. The method of manufacturing a semiconductor device according to claim 1, wherein the second liquid is supplied through a first set of pipes coupled to the drainage groove at regular intervals in a plan view.

13. The method of manufacturing a semiconductor device according to claim 1, wherein the drainage groove has an inner wall, an outer wall and a floor.

14. The method of manufacturing a semiconductor device according to claim 1, further comprising:
    measuring, using a liquid level sensor located in the drainage groove, the level of the liquid remaining in the drainage groove.

15. The method of manufacturing a semiconductor device according to claim 1, further comprising:
    draining, using a drainage mechanism fluidly coupled to the drainage groove, the liquid remaining in the drainage groove.

16. The method of manufacturing a semiconductor device according to claim 1, further comprising:
    fixing, using a substrate suction section, the substrate on the stage by applying a negative pressure to the back side of the substrate,
    wherein the substrate suction section includes a suction pipe fluidly coupled to a plurality of suction holes in the stage, and
    wherein the substrate suction section is not fluidly coupled to the drainage groove.

17. The method of manufacturing a semiconductor device according to claim 12, wherein the second liquid is selectively supplied through a second set of pipes coupled to the drainage groove at regular intervals in a plan view, the second set of pipes having a larger diameter that the first set of pipes.

* * * * *